United States Patent [19]
Yokoyama et al.

[11] Patent Number: 5,897,608
[45] Date of Patent: Apr. 27, 1999

[54] COMPENSATING APPARATUS AND METHOD FOR SIGNAL PROCESSING CIRCUIT

[75] Inventors: Itoshi Yokoyama; Masaaki Nagai; Yoshimichi Sanada, all of Yokohama, Japan

[73] Assignee: Leader Electronics, Corp., Yokohama, Japan

[21] Appl. No.: 08/863,292

[22] Filed: May 27, 1997

Related U.S. Application Data

[63] Continuation of application No. 08/319,786, Oct. 7, 1994, abandoned.

[30] Foreign Application Priority Data

Oct. 8, 1993 [JP] Japan ..................................... 5-252807

[51] Int. Cl.⁶ .................................................. G01R 35/00
[52] U.S. Cl. .......................... 702/107; 702/106; 702/189; 348/180; 348/616; 348/909
[58] Field of Search ................... 702/85, 90, 99, 702/106, 107, 189, 193, 194; 324/601, 606, 76.19, 76.22; 348/180, 184, 189, 607, 616, 909, 602, 618, 656, 657, 678; 73/1.01, 1.11, 1.44

[56] References Cited

U.S. PATENT DOCUMENTS

| | | | |
|---|---|---|---|
| 4,701,788 | 10/1987 | Desjardins | 348/656 |
| 4,866,615 | 9/1989 | Ichihara | 364/571.04 |
| 4,931,976 | 6/1990 | Olivenbaum et al. | 364/571.04 |
| 5,016,202 | 5/1991 | Seibel et al. | 364/571.07 |
| 5,262,957 | 11/1993 | Hearn | 364/485 |
| 5,291,276 | 3/1994 | Matsumoto et al. | 348/180 |
| 5,291,285 | 3/1994 | Yokoyama et al. | 348/180 |

OTHER PUBLICATIONS

Instruction Manual of TC–90 TV/SAT Signal Meter, manufactured by Sadelta, printed Jul. 1989.
Copy of Correction Diagram attached to panel cover of TC–90 TV/SAT Signal Meter manufactured by Sadelta. (No date).
Instruction Manual of TV Signal Level Meter Model LFC–946A, manufactured by Leader Electronics Corp printed Jul. 1978, pp. 4, 5, and 10 (No English translation).
Instruction Manual of Spectrum Analyzer R3265/3271 manufactured by Advantest Corp., printed Nov. 30, 1990 pp. 3–7 (No English translation).
Instruction Manual of Satellite Broadcasting CN Ratio Checker KTV–635, 640 manufactured by Kyoritsu Denshi Kogyo Kabushiki Kaisha, printed Nov. 1988, p. 15 (No English translation).
Copy of Calibration Tables of Satellite Broadcasting CN Ratio Check KTV–635, provided inside the appendant casing (No English translation/No date).

*Primary Examiner*—Hal Dodge Wachsman
*Attorney, Agent, or Firm*—Fish & Richardson, P.C.

[57] ABSTRACT

A compensating method and apparatus is provided which collectively compensates for variations in a variety of characteristics in respective circuit portions of a signal processing circuit. A correction data generator is provided for generating correction value data for correction to be made for an output signal of the signal processing circuit, in order to compensate for variations in the characteristics of the at least one circuit portion. Also, a compensator is connected to receive an output signal from the signal processing circuit as well as to receive the correction value data from the correction data generating means, for correcting the output signal in accordance with the respective correction value data corresponding to the at least one circuit portion to generate a compensated output signal.

36 Claims, 18 Drawing Sheets

Fig. 3

| BLOCK | CONDITIONS CAUSING LEVEL ERROR ||| CORRECTION TABLES AND THEIR VARIABLES ||
|---|---|---|---|---|---|
| | STATIC CIRCUIT CONDITION | DYNAMIC CIRCUIT CONDITION | CIRCUIT ENVIRONMENTAL CONDITION | | |
| RF ATT 110 | | ATTENUATION FREQUENCY | | X1 | ATTENUATION (j) FREQUENCY (i) |
| VHF/UHF TUNER 121 | CONVERSION GAIN | FREQUENCY | TEMPERATURE | | TEMPERATURE (m) |
| IF ATT 122 | | ATTENUATION | TEMPERATURE | X2 | ATTENUATION (k) TEMPERATURE (n) |
| CONVERTER 123 | CONVERSION GAIN | | | | |
| BPF 124 | INSERTION LOSS | | | | |
| IF AMP 125 | GAIN | | TEMPERATURE | X3 | TEMPERATURE (p) |
| PEAK DET. 126 | DETECTION LINEARITY | | | X4 | DETECTION LINEARITY (q) |
| ENTIRE TV SYSTEM | TOTAL GAIN | | | X5 | GAIN |

NOTE 1) X1, X2, X3, X4, X5 ARE CORRECTION TABLES FOR RESPECTIVE BLOCK.

NOTE 2) j, i, m, k, n, p, q ARE VARIABLES OF RESPECTIVE CONDITIONS.

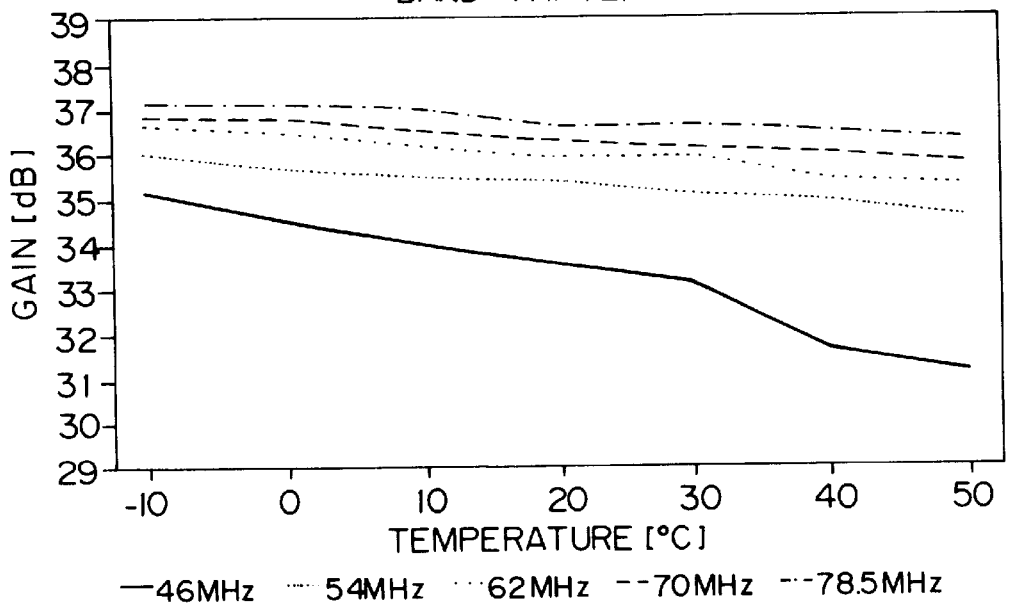
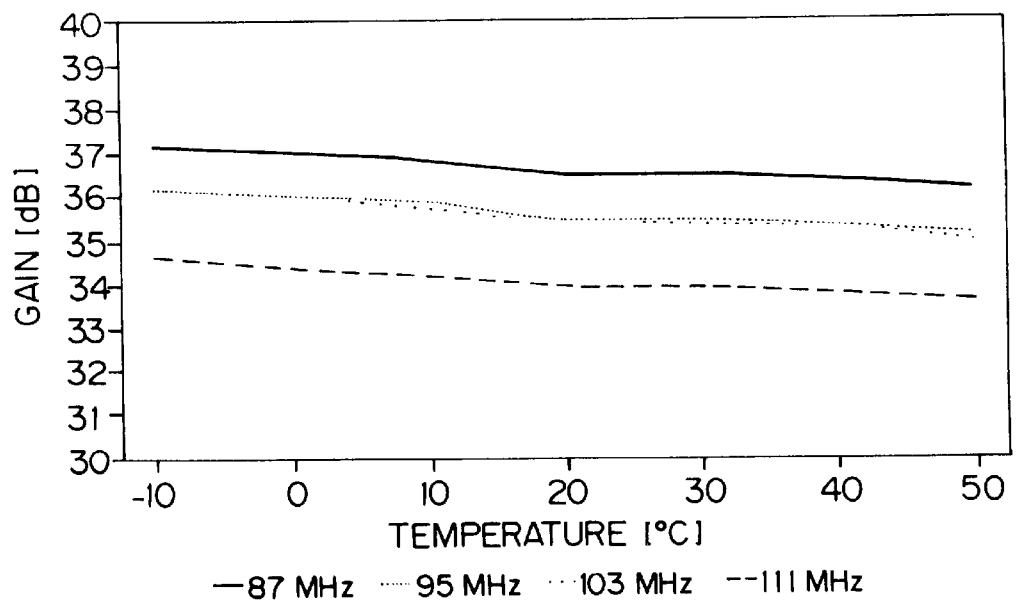

TEMPERATURE-GAIN CHARACTERISTICS
BAND: VHF (S)

—220.05 MHz ····· 251 MHz ··· 282 MHz ‑‑313 MHz ‑·‑345 MHz

TEMPERATURE-GAIN CHARACTERISTICS
BAND: VHF (S)

—376 MHz ····· 407 MHz ··· 438 MHz ‑‑470 MHz

Fig.14

CORRECTION TABLE X1

| FREQUENCY [MHz] (i) | TEMPERATURE [°C] (m) | RF ATTENUATION [dB] (j) | | | | |
|---|---|---|---|---|---|---|
| | | 0 | 10 | 20 | ... | 60 |
| 46.00 | -10 | -3 | -3 | -2 | ... | 1 |
| | 0 | -2 | -2 | -1 | ... | 0 |
| | 10 | -1 | -1 | -1 | ... | 0 |
| | 20 | 0 | 0 | 0 | ... | 1 |
| | 30 | 0 | 0 | 1 | ... | 1 |
| | 40 | 1 | 1 | 1 | ... | 2 |
| | 50 | 1 | 1 | 2 | ... | 2 |
| | 60 | 2 | 2 | 2 | ... | 3 |
| 46.05 | -10 | -3 | -3 | -2 | ... | 1 |
| | 0 | -2 | -2 | -1 | ... | 0 |
| | 10 | -1 | -1 | -1 | ... | 0 |
| | 20 | 0 | 0 | 0 | ... | 1 |
| | 30 | 0 | 0 | 1 | ... | 1 |
| | 40 | 1 | 1 | 1 | ... | 2 |
| | 50 | 1 | 1 | 2 | ... | 2 |
| | 60 | 2 | 2 | 2 | ... | 3 |
| ⋮ | ⋮ | | | | ⋮ | |
| 870.00 | -10 | -1 | -1 | -1 | ... | 0 |
| | 0 | -1 | -1 | 0 | ... | 0 |
| | 10 | -1 | 0 | 0 | ... | 0 |
| | 20 | 0 | 0 | 0 | ... | 1 |
| | 30 | 0 | 0 | 1 | ... | 1 |
| | 40 | 0 | 1 | 1 | ... | 2 |
| | 50 | 1 | 1 | 2 | ... | 2 |
| | 60 | 2 | 2 | 2 | ... | 3 |

Fig. 15

CORRECTION TABLE X2

| IF ATTENUATION [dB] (k) | TEMPERATURE [°C] (n) | CORRECTION DATA [dB] |
|---|---|---|
| 0 | -10 | -0.10 |
|   | 0 | -0.10 |
|   | 10 | -0.10 |
|   | 20 | -0.10 |
|   | 30 | -0.10 |
|   | 40 | -0.10 |
|   | 50 | -0.10 |
|   | 60 | -0.10 |
| 5 | -10 | -1.70 |
|   | 0 | -1.70 |
|   | 10 | -1.70 |
|   | 20 | -1.70 |
|   | 30 | -1.70 |
|   | 40 | -1.70 |
|   | 50 | -1.70 |
|   | 60 | -1.70 |
| 10 | -10 | -1.87 |
|   | 0 | -1.70 |
|   | 10 | -1.53 |
|   | 20 | -1.38 |
|   | 30 | -1.30 |
|   | 40 | -1.33 |
|   | 50 | -1.38 |
|   | 60 | -1.38 |
| ⋮ | ⋮ | ⋮ |
| 65 | -10 | -4.25 |
|   | 0 | -3.60 |
|   | 10 | -2.95 |
|   | 20 | -2.48 |
|   | 30 | -2.10 |
|   | 40 | -2.00 |
|   | 50 | -1.92 |
|   | 60 | -1.62 |

Fig. 16

CORRECTION TABLE X3

| TEMPERATURE [°C] (p) | CORRECTION DATA [dB] |
|---|---|
| -10 | 0 |
| 0 | 0 |
| 10 | 0 |
| 20 | 0 |
| 30 | 0 |
| 40 | 0 |
| 50 | 0.48 |
| 60 | 1.17 |

Fig. 18

CORRECTION TABLE X4

| | | LEVEL DATA [dB] |
|---|---|---|
| | 0 | 0.0 |
| | 1 | 0.0 |
| | 2 | 0.0 |
| | ⋮ | ⋮ |
| | 378 | 0.0 |
| | 379 | 0.0 |
| | ⟨380⟩ | ⟨0.0⟩ (2V) |
| | 381 | 0.0 |
| | 382 | 0.1 |
| | 383 | 0.2 |
| | 384 | 0.2 |
| | 385 | 0.3 |
| | 386 | 0.3 |
| | 387 | 0.4 |
| | 388 | 0.4 |
| | 389 | 0.5 |
| A/D DATA | 390 | 0.6 |
| (q) | 391 | 0.6 |
| | 392 | 0.7 |
| | 393 | 0.7 |
| | 394 | 0.8 |
| | 395 | 0.8 |
| | 396 | 0.9 |
| | 397 | 0.9 |
| | ⟨398⟩ | ⟨1.0⟩ |
| | 399 | 1.0 |
| | 400 | 1.1 |
| | 401 | 1.1 |
| | ⋮ | ⋮ |
| | 990 | 8.9 |
| | 991 | 8.9 |
| | ⟨992⟩ | ⟨9.0⟩ (5V) |
| | 993 | 9.0 |
| | 994 | 9.0 |
| | 995 | 9.0 |
| | ⋮ | ⋮ |
| | 1021 | 9.0 |
| | 1022 | 9.0 |
| | 1023 | 9.0 |

# COMPENSATING APPARATUS AND METHOD FOR SIGNAL PROCESSING CIRCUIT

This application is a continuation of U.S. application Ser. No. 08/319,786, filed Oct. 7, 1994, now abandoned.

BACKGROUND OF THE INVENTION

1. Field of the Invention

The present invention relates generally to signal processing circuits such as measuring circuits, and more particularly to a compensating apparatus and method for collectively compensating for variations in characteristics of such signal processing circuits caused by a variety of factors. The present invention is also directed to a collectively-compensating-type signal processing circuit provided with such a compensating apparatus.

2. Prior Art

Conventionally, when a measuring device is to be used, warm-up time is provided for the device prior to measurements, during which the measuring device is placed in an operable environment such that circuits within the measuring device has reached a thermally balanced state. For example, devices such as a standard signal generator, spectrum analyzer, power meter, TV level meter, and so on, require a warm-up time of at least 30 minutes or more, normally one hour. Particularly, with electronic circuits arranged within devices associated with high frequencies, since they must be designed to exhibit a low impedance, electric power consumed by respective parts correspondingly becomes large. Some of such devices require a warm-up time of not less than two hours.

Also, a conventional measuring device is externally provided with correction tables (e.g., a correction table for correcting erroneous indications caused by varying temperatures or frequencies) for correcting errors due to variations which cannot be compensated for within the circuits of the measuring device, i.e., variations which cannot be attended to by existing circuit techniques. Thus, the user refers to such correction tables to find a corrected indication value in the table corresponding to an output value indicated by the device.

Conventional signal processing apparatuses including measuring devices as described above, thus, has a drawback that they require long warm-up time and therefore cannot be used immediately after power on. Also, the long warm-up time makes a battery less suitable for powering the device. The measuring device using external correction tables renders the measurement inconvenient and complicated. Further, it is difficult, or expensive even if possible, to compensate for complicated short- or long-term variations occurring in conventional signal processing circuits through the use of conventional circuit techniques.

OBJECTS AND SUMMARY OF THE INVENTION

It is therefore an object of the present invention to provide a method and apparatus capable of collectively compensating for variations in a variety of characteristics of interest in a signal processing circuit, and a collective-compensation-type signal processing circuit which incorporates such a compensating method.

It is another object of the present invention to provide a method and apparatus capable of compensating for variations in a variety of characteristics of interest in a signal processing circuit externally to the signal processing circuit, and a signal processing circuit which incorporates such a compensating method.

It is a further object of the present invention to provide a method and apparatus capable of compensating for complicated variations in characteristics of interest in a signal processing circuit externally to the signal processing circuit, and a signal processing circuit which incorporates such a compensating method.

It is a yet further object of the present invention to provide a signal processing apparatus which reduces or substantially eliminates warm-up time.

It is a still further object of the present invention to provide at a low cost a measuring device capable of performing highly accurate measurements.

To achieve the above objects, the present invention provides a method of compensating a signal processing circuit wherein said signal processing circuit is operative to receive an input signal and generate an output signal, said signal processing circuit including at least one circuit portion having characteristics varying dependent upon at least one of a static circuit condition, a dynamic circuit condition and a circuit environmental condition, said method comprising the steps of: (a) providing correction value data for correction to be made for the output signal of said signal processing circuit, in order to compensate for variations in the characteristics of said at least one circuit portion; (b) applying said signal processing circuit with a given input signal to acquire an output signal corresponding thereto; and (c) correcting said output signal corresponding to said given input signal in accordance with said respective correction value data of said at least one circuit portion, to generate a compensated output signal.

According to the present invention, said correction value data may be provided in the form of a correction value table.

Also, according to the present invention, said at least one circuit portion may include a first circuit having characteristics varying dependent upon said dynamic circuit condition and said circuit environmental condition. In this case, said step (a) includes providing, for said first circuit, a first correction value table including at least one parameter or variable associated with said dynamic circuit condition and at least one parameter or variable associated with said circuit environmental condition, and said step (c) includes retrieving and using a correction value for said first circuit from said first correction value table in response to a combination of respective current value of said at least one parameter associated with said dynamic circuit condition and a respective current value of said at least one parameter associated with said circuit environmental condition. The characteristics of said first circuit may also vary dependent upon said static circuit condition.

Further, according to the present invention, said at least one circuit portion may include a second circuit having characteristics varying dependent upon said circuit environmental condition. In this case, said step (a) includes providing, for said second circuit, a second correction value table including at least one parameter or variable associated with said circuit environmental condition, and said step (c) includes retrieving and using a correction value for said second circuit from said second correction value table in response to a respective current value of said at least one parameter associated with said circuit environmental condition. The characteristics of said second circuit may also vary dependent upon said static circuit condition.

According to the present invention, said at least one circuit portion may include a third circuit having characteristics varying dependent upon said dynamic circuit condition. In this case, said step (a) includes providing, for said third circuit, a third correction value table including at least one parameter or variable associated with said dynamic circuit condition; and said step (c) includes retrieving and using a correction value for said third circuit from said third correction value table in response to a respective current value of said at least one parameter associated with said dynamic circuit condition. The characteristics of said third circuit may also vary dependent upon said static circuit condition.

According to the present invention, said at least one circuit portion may include a fourth circuit having characteristics only varying dependent upon said static circuit condition. In this case, said step (a) includes providing, for said fourth circuit, a fourth correction value table including a parameter or variable associated with the magnitude of said output signal of said signal processing circuit; and said step (c) includes retrieving and using a correction value for said fourth circuit from said fourth correction value table in response to a current value of said parameter associated with said output signal.

According to the present invention, said dynamic circuit condition, said circuit environmental condition, and said static circuit condition may each include at least one parameter or variable.

The present invention also provides a compensating apparatus for a signal processing circuit, wherein said signal processing circuit is operative to receive an input signal and generate an output signal, said signal processing circuit including at least one circuit portion having characteristics varying dependent upon at least one of a static circuit condition, a dynamic circuit condition and a circuit environmental condition, said compensating apparatus comprising: (a) correction data generating means for generating correction value data for correction to be made for said output signal of said signal processing circuit, in order to compensate for variations in the characteristics of said at least one circuit portion; and (b) correcting means connected to receive said output signal from said signal processing circuit and also connected to receive said correction value data from said correction data generating means, for correcting said output signal in accordance with said respective correction value data corresponding to said at least one circuit portion to generate a compensated output signal.

BRIEF DESCRIPTION OF THE DRAWINGS

The present invention will hereinafter be described in connection with preferred embodiments thereof with reference to the accompanying drawings:

FIG. 3 is a table showing conditions or factors causing level errors for respective circuits in a TV circuit system of the TV level meter illustrated in FIG. 2;

FIGS. 4 and 5 are graphs respectively showing the temperature versus gain characteristics of a tuner arranged in the level meter of FIG. 2 in a VHF (L) band;

FIGS. 14, 15, and 16 are tables showing examples of correction tables X1, X2, and X3, respectively;

FIG. 18 is a table showing an example of the correction table X4;

DESCRIPTION OF THE PREFERRED EMBODIMENTS

Figure 1:
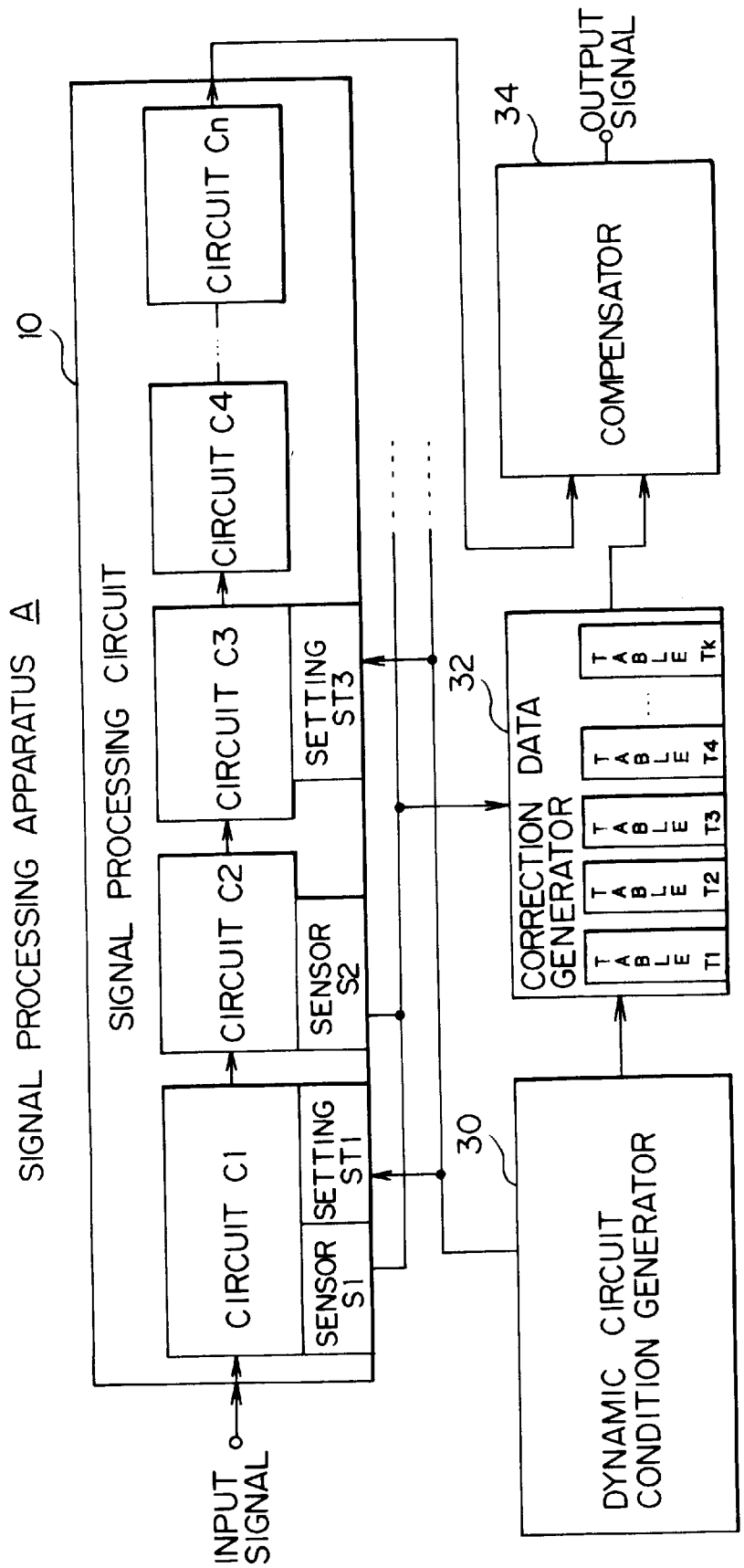
FIG. 1 is a block diagram showing a basic configuration of a signal processing apparatus according to the present invention for performing collective compensation processing.

FIG. 1 shows a basic configuration of a signal processing apparatus $\underline{A}$ in which collective compensation processing is performed in accordance with the present invention. The signal processing apparatus $\underline{A}$ is mainly composed of a signal processing circuit 10, a dynamic circuit condition generator 30, a correction data generator 32, and a compensator 34. The signal processing circuit 10 includes at least one circuit, or circuits C1–Cn (n≧1) in the illustrated embodiment which process received input signals.

According to the present invention, circuits are classified into several types based on three factors, i.e., "static circuit condition", "dynamic circuit condition", and "circuit environmental condition". Here, the "static circuit condition" refers to any condition constantly existing in a circuit of interest or a substantially or relatively permanent condition (for example, the characteristics of used elements); the "dynamic circuit condition" to any condition temporarily existing in a circuit of interest or a variable condition (for example, frequency, attenuation ratio, and so on in operation); and the "circuit environmental condition" to any environmental condition in which a circuit of interest is placed (for example, temperature, humidity, pressure, and so on). The following table shows the types of circuits.

TABLE 1

| Circuit Type | Static Circuit Condition | Dynamic Circuit Condition | Circuit Environmental Condition |
|---|---|---|---|
| 1 | Present | Present | Present |
| 2 | Absent | Present | Present |

TABLE 1-continued

| Circuit Type | Static Circuit Condition | Dynamic Circuit Condition | Circuit Environmental Condition |
|---|---|---|---|
| 3 | Present | Absent | Present |
| 4 | Absent | Absent | Present |
| 5 | Present | Present | Absent |
| 6 | Absent | Present | Absent |
| 7 | Present | Absent | Absent |

Circuit C1 in FIG. 1, which represents an example of Circuit Types 1 and 2, includes a sensor section S1 for sensing the circuit environmental condition and a condition setting section ST1 for setting one of a plurality of selectable operating conditions. Circuit C2, representing an example of Circuit Types 3 and 4, only includes a sensor section S2 for sensing the circuit environmental condition. Also, a circuit C3, representing an example of Circuit Types 5 and 6, only includes a condition setting section ST3 for setting one of a plurality of selectable operating conditions. A circuit C4, representing Circuit Type 7, does not have a sensor section or a condition setting section.

The dynamic circuit condition generator 30 generates individual operating conditions to be set by the condition setting sections in the circuits C1, C3, and other circuits not shown (in the drawing, connecting lines between the generator 30 and the circuits are simply represented by one line). The correction data generator 32 is connected to receive signals from the sensors in the circuit C2 and so on in the signal processing circuit 10 as well as receives the same operating conditions generated by the generator 30 for the condition setting sections of the circuits C1, C3, and so on, and delivers correction data at its output. The correction data is applied to the compensator 34 which subjects an output signal from the signal processing circuit 10 to a correction in accordance with the correction data to generate a compensated or corrected final output signal.

According to an embodiment of the present invention, the correction data generator 32 may include correction value tables T1–Tk (K≧1), such as look-up tables, corresponding to respective circuits or respective circuit groups (also including the entire signal processing circuit 10) which require the correction according to the present invention.

The signal processing apparatus A configured as described above collectively compensates for errors due to variations in the characteristics of the respective circuits in the signal processing circuit 10 from the desired characteristics thereof, externally to the circuits, and on top of that, at the output of the signal processing circuit 10. Therefore, the respective circuits in the signal processing circuit 10 may be such that can merely ensure significant or minimally required operations to received input signals. Stated another way, the respective circuits need not realize their ideal or maximal characteristics. It should be noted that the signal processing circuit 10 may be divided into circuit portions so as to facilitate corrections required thereto.

Figure 2:
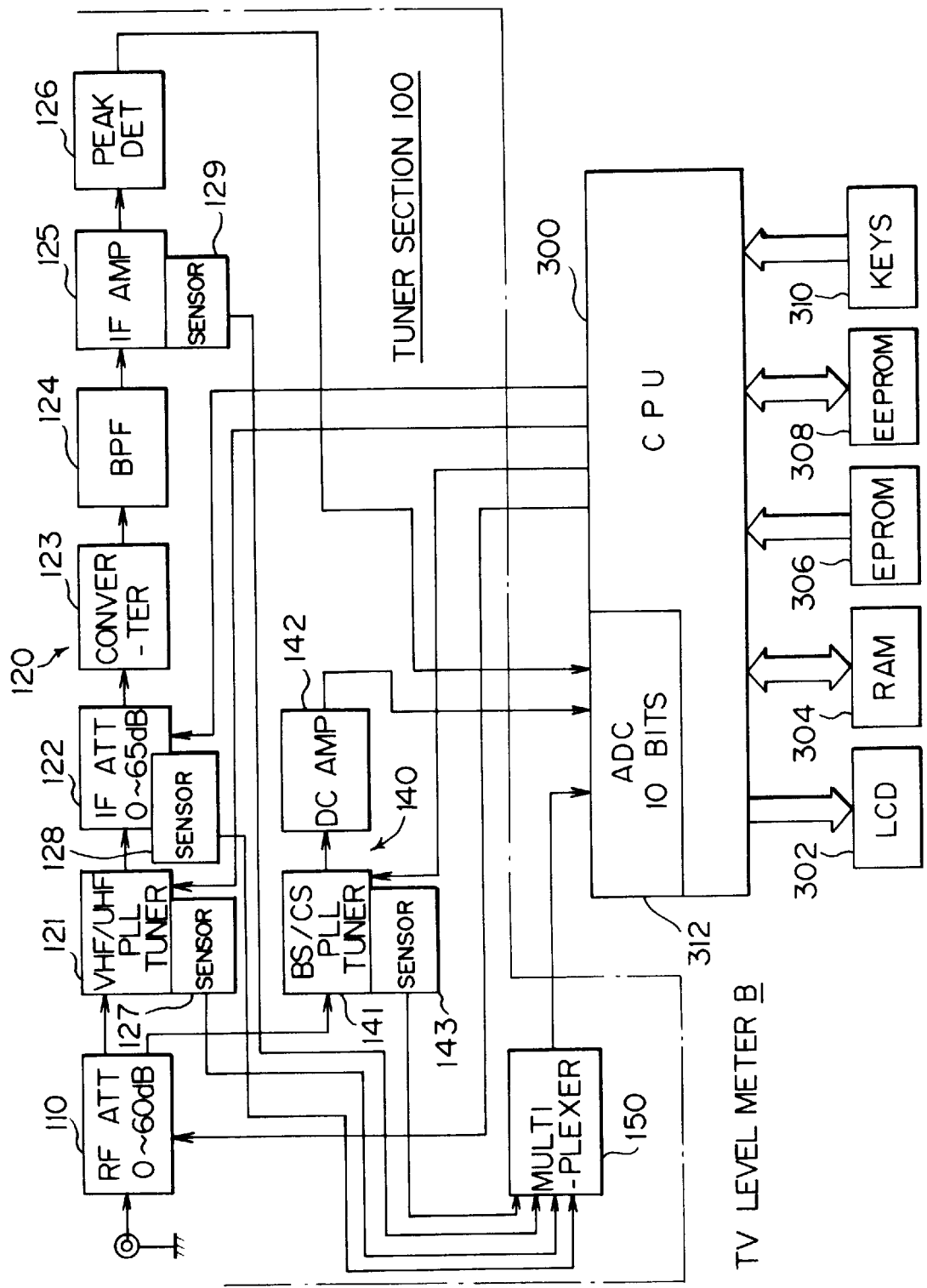
FIG. 2 is a block diagram showing a measuring device or a TV level meter which represents one embodiment of the present invention.
Figure 6:
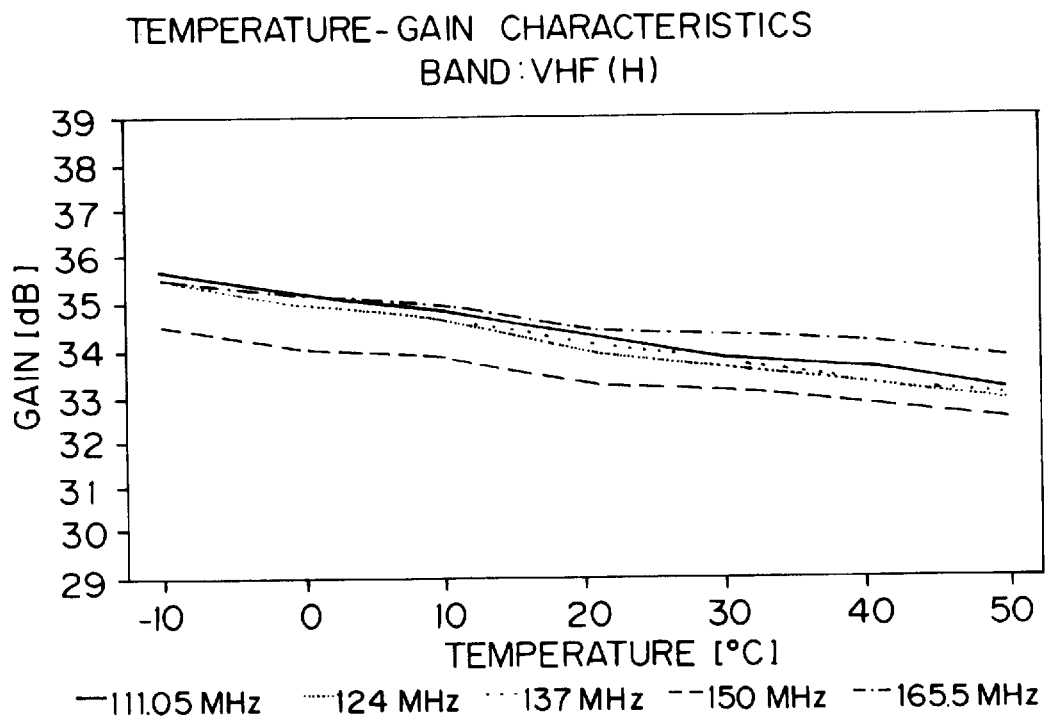
FIGS. 6 and 7 are graphs respectively showing the temperature versus gain characteristics of the tuner of the level meter of FIG. 2 in a VHF (H) band.
Figure 7:
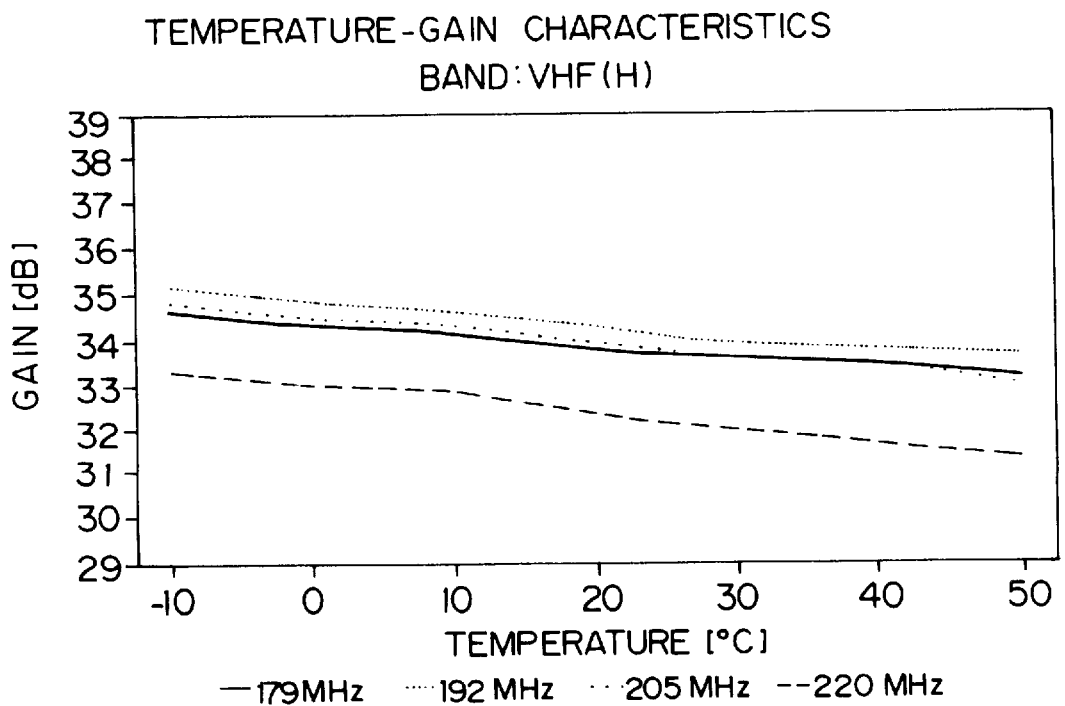
Figure 8:
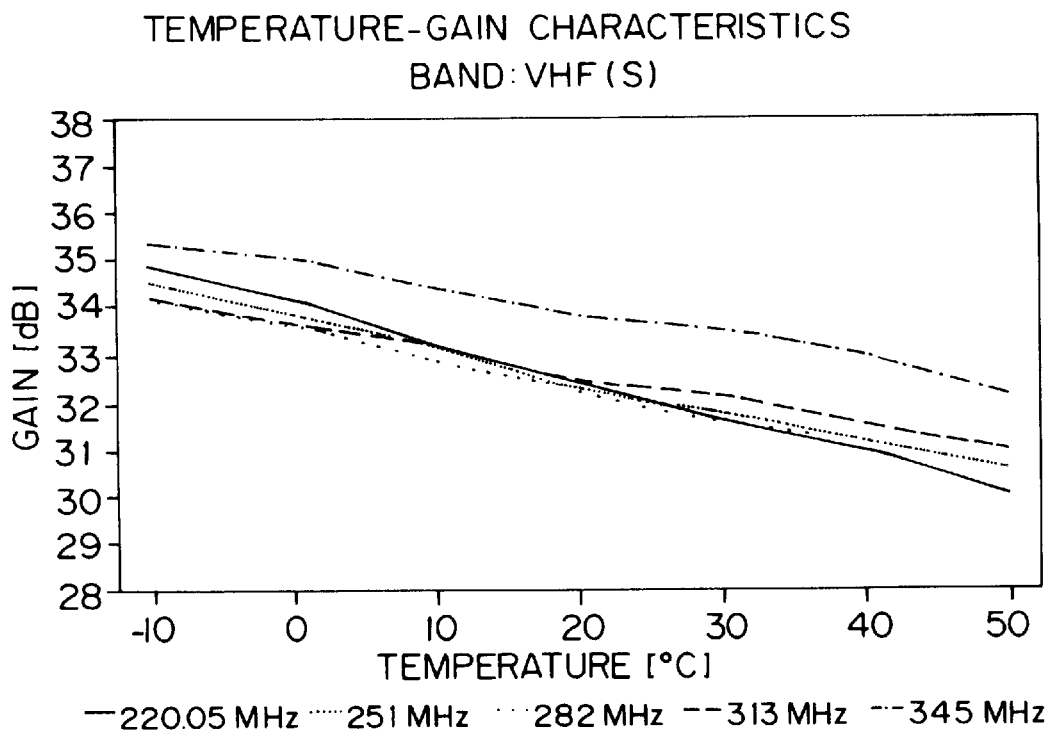
FIGS. 8 and 9 are graphs respectively showing the temperature versus gain characteristics of the tuner of the level meter of FIG. 2 in a VHF (S) band.
Figure 9:
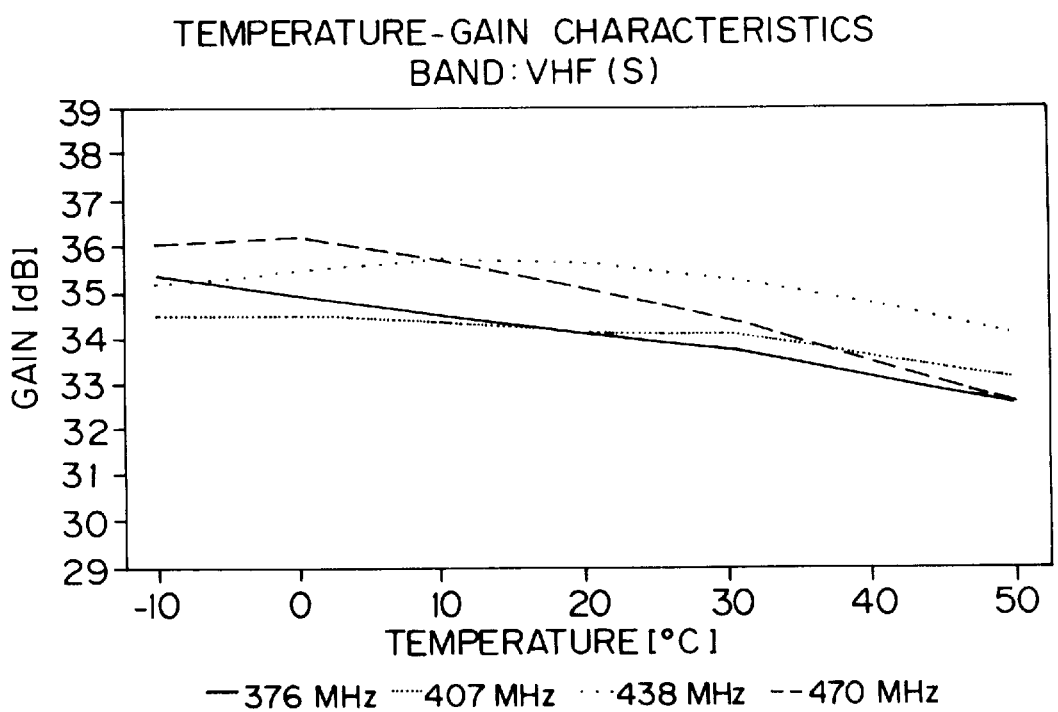
Figure 10:
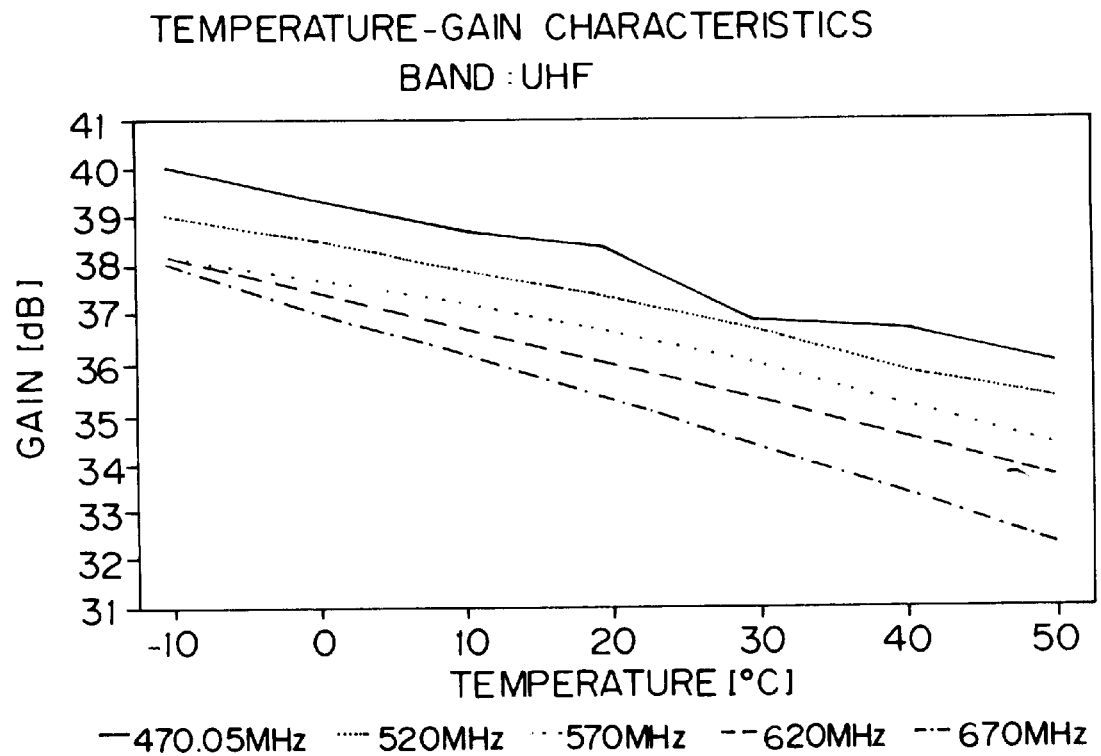
FIGS. 10 and 11 are graphs respectively showing the temperature versus gain characteristics of the tuner of the level meter of FIG. 2 in a UHF band.
Figure 11:
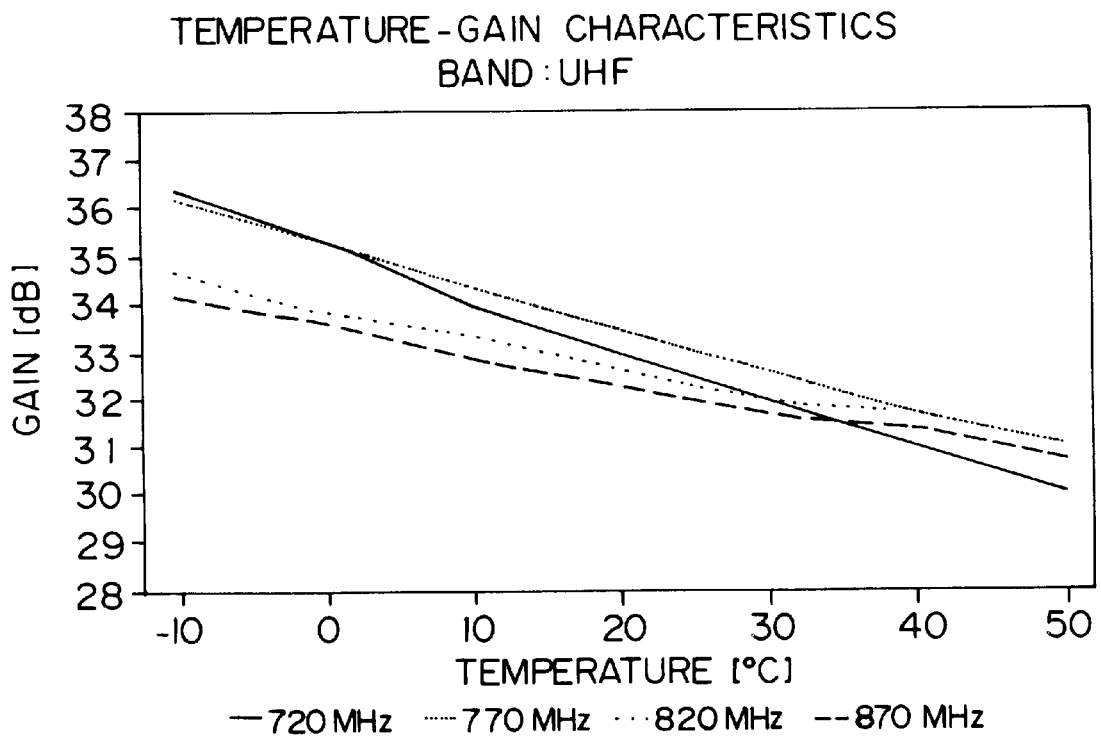
Figure 12:
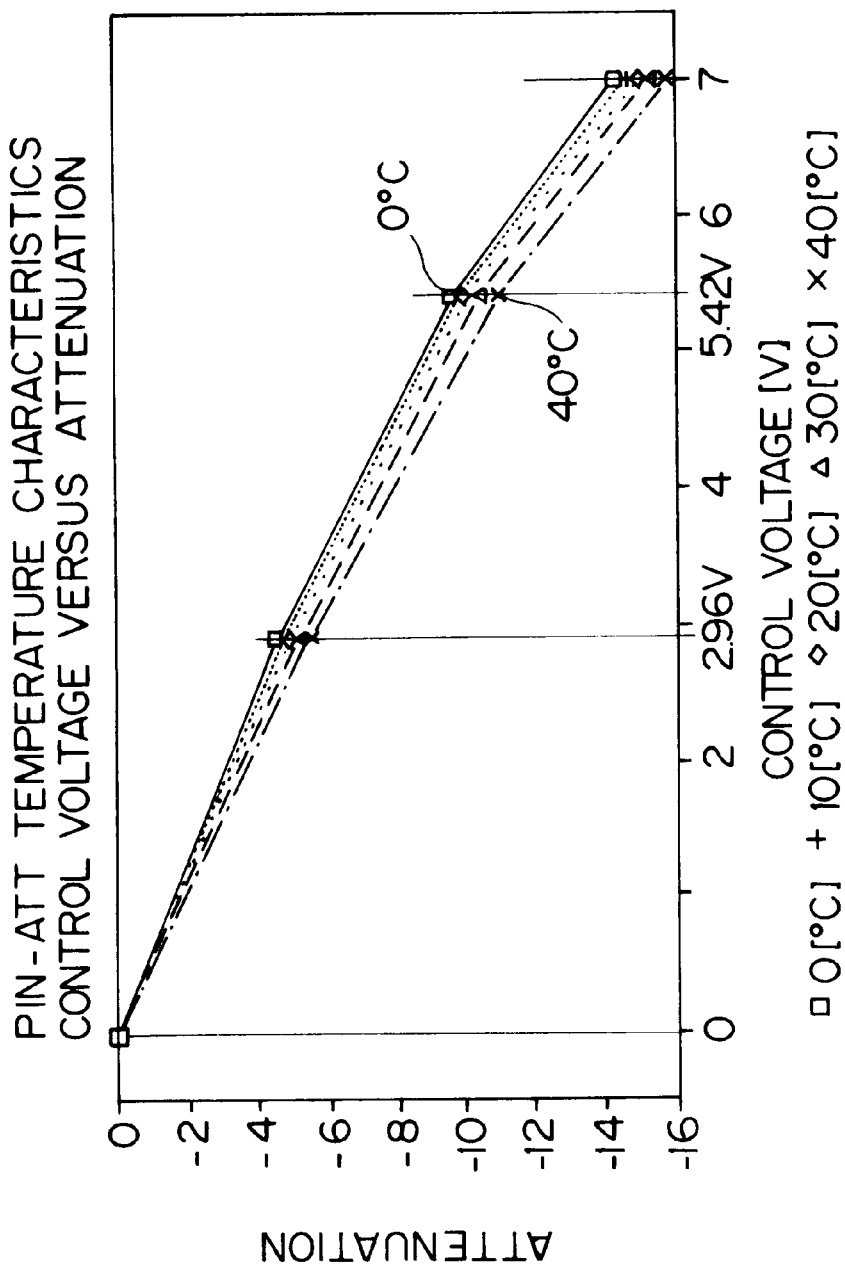
FIG. 12 is a graph showing the temperature characteristics of a pin attenuator used in an intermediate frequency attenuator in the level meter of FIG. 2.

FIG. 2 shows a TV level meter B which is an embodiment of the signal processing apparatus according to the present invention. Particularly pointed out here is that TV level meter B can also be powered by a battery. The level meter B includes a tuner section 100; a central processing unit (CPU) 300; a display 302, for example, a liquid crystal display formed of 128×160 dots matrix; a RAM 304 for storing part of software; an EPROM 306 for storing software and correction value tables; an EEPROM 308 for storing data; and a keyboard 310.

The tuner section 100 includes a programmable radio frequency attenuator (RF ATT) 100 (providing attenuation of 0 to 60 dB with a 10 dB step) connected to an input terminal, and a TV circuit section 120 and SAT circuit section 140 which respectively receive an attenuated output from the attenuator 100.

The TV circuit section 120 includes a PLL tuner 121 for VHF/UHF bands, a programmable intermediate frequency attenuator (IF ATT) 122, a converter 123, a bandpass filter (BPF) 124, an IF amplifier 125 and a peak detector 126. The PLL tuner 121 receives the attenuated output of RF ATT 110. A first IF output (at 34.7 MHz) from the PLL tuner 121 is applied to IF ATT 122 including a pin attenuator which uses a pin diode and controls an attenuation with a control voltage. The IF ATT 122 provides the received first IF output with attenuation of 0 to 65 dB at intervals of 5 dB. An attenuated output from IF ATT 122 is applied to the converter 123 which has a local oscillating frequency of 45.4 MHz and converts the attenuated output from IF ATT 122 to a second IF frequency (10.7 MHz). The output of the converter 123 is applied to the bandpass filter (BPF) 124 which has the center frequency of 10.7 MHz and the bandwidth of 280 KHz. The output of the bandpass filter 124 is applied to the IF amplifier 125 the output of which is applied to the peak detector 126. The output of the peak detector 126 is coupled to an input (logarithmic input) of a 10-bit analog-to-digital (A/D) converter 312 in the CPU 300. The CPU 300 provides an automatic range selecting operation such that the output of the peak detector 126 falls within a range of 0–9 dB (corresponding to 2–5 volts) by applying respective attenuation setting inputs of the RF ATT 110 and IF ATT 121 with attenuation specifying signals. The CPU 300 also supplies the tuner 121 with a signal for specifying a tuning frequency.

The SAT circuit section 140 includes a broadcasting satellite/communication satellite (BS/CS) tuner 141 having a bandwidth of 24 MHz and connected to the output of RF ATT 110, and a direct current amplifier (DC AMP) 142 for amplifying a detected output from the tuner 141. The output of the amplifier 142 is similarly connected to an input (logarithmic input) of ADC 312 in the CPU 300. The CPU 300 applies RF ATT 110 with an attenuation specifying signal such that the output of the amplifier 142 falls within a range of 0–30 dB. The CPU 300 also supplies the tuner 141 with a signal for specifying a tuning frequency.

The tuner section 100 further includes temperature sensors 127, 128, 129 and 143. The sensors 127, 128 and 129 sense the temperatures of the VHF/UHF tuner 121, IF ATT 122 and IF AMP 125, respectively. The sensor 143 senses the temperature of the BS/CS tuner 141. Outputs from the temperature sensors are connected to inputs of ADC 312 through a multiplexer 150.

ADC 312 converts one of three inputs, i.e., inputs from the peak detector 126, the direct current amplifier 142 and the multiplexer 150, specified by the CPU 300, into a digital signal which is supplied to the CPU 300.

FIG. 3 is a table listing conditions and factors or parameters which may cause level errors in respective circuits in the TV circuit system. As illustrated, in the embodiment, RF ATT 110 has two factors or parameters as the dynamic circuit condition which are frequency and attenuation during operation. The tuner 121 in turn has temperature as a factor or parameter of the circuit environmental condition, frequency as a factor or parameter of the dynamic circuit condition, and conversion gain as a factor or parameter of the static circuit condition. It should be noted that the conversion gain may cause a level error due to variations of elements used in the tuner 121. FIGS. 4–11 show the temperature versus gain characteristics of the tuner 121 in frequency bands from the VHF (L) band to the VHF (S) band, and in the UHF band, respectively. As will be understood from the graphs, the characteristics exhibit complicated changes. IF ATT 122, which employs a pin attenuator as mentioned above, presents larger temperature dependent errors in attenuations as the attenuations are larger. The converter (CONVERTER) 123, BPF 124 and peak detector 126 only have a respective factor or parameter of the static circuit condition, i.e., conversion gain, insertion loss, and detection linearity which may cause level errors due to variations of used elements associated with the respective circuits. IF AMP 125 has gain as a factor or parameter of the static circuit condition and temperature as a factor or parameter of the circuit environmental condition. The entire TV system including RF ATT 110 and TV circuit section 120 has total gain as a factor or parameter of the static circuit condition.

As the level error causing conditions for the SAT circuit system, the tuner 141 has conditions similar to those of the tuner 121 and also has detection linearity as the static circuit condition just like the peak detector 126. It should be noted that a compensating method for the SAT circuit system may be implemented by a like method for the TV circuit system, so that explanation thereon will be omitted in the following explanation.

Next, the correction tables used in the embodiment will be explained. Five correction tables are provided for use with the TV circuit system, which are designated X1–X5, respectively, as shown in FIG. 3. Table X1 is assigned to the correction for two circuit blocks. For the converter 123 and BPF 124, no correction table is provided individually. Instead, a table X5 is provided for the total gain of the entire TV system including a conversion gain of the tuner 121.

Next, a correction table creating method and illustrative tables created thereby will be explained below in connection with the correction tables X1–X5.

Figure 13:
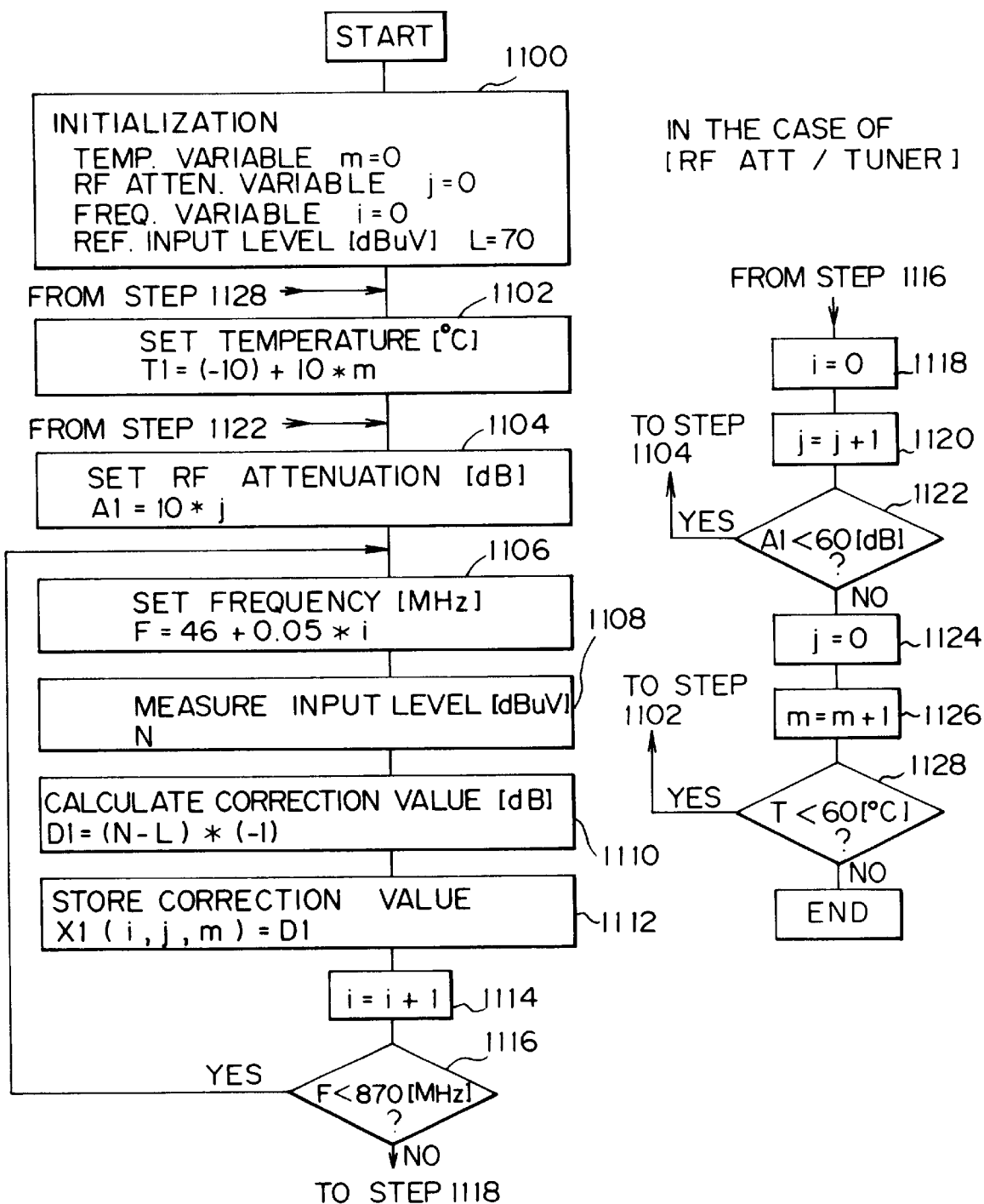
FIG. 13 is a flowchart showing a procedure of creating a correction table X1.

FIG. 13 shows a flow for creating the correction table X1. First at step 1100, a temperature variable $m$, an attenuation variable $j$, and a frequency variable $i$ are initialized, and the level of a reference input applied to the input terminal of the TV level meter shown FIG. 2 is set to 70 dBuV. While this correction table is being created, variation factors or parameters such as temperature, frequency, attenuation, and so on are maintained constant. Next, a temperature set value T1 is varied at intervals of 10° C. at step 1102, an attenuation set value A1 is varied at intervals of 10 dB at step 1104, and a frequency set value F is varied at intervals of 0.05 MHz at step 1106. In the first pass going through steps 1108–1112, an input level measurement is performed by determining an output level N (after D/A conversion) of the peak detector 126 under the following condition: T1=−10° C., A1=0 dB, and F=46 MHz. From the determined output level, a correction value D1 is calculated by subtracting the reference level from the determined level, and multiplying the subtraction result by −1. The calculated correction value D1 is next stored in the table X1 at a location defined by the variables $i$, $j$, and $m$ which are all zeros in the first pass. At step 1114, the variable $i$ is incremented by one to prepare for the next frequency set value. At step 1116, the flow is returned to and repeated from step 1106 until the frequency set value is increased to 870 MHz so as to perform input level measurements with the frequency set value F ranging from 46 MHz to 870 MHz. After completing this process, the frequency setting variable $i$ is reset to zero at step 1118 so as to allow input level measurements to be made again in the frequency range of 46 MHz to 870 MHz. At step 1120, the attenuation variable $j$ is incremented by one to prepare for the measurements of the input level with the next attenuation set value. At step 1122, the flow is returned to and repeated from step 1104 until A1 is equal to 60 dB, so as to perform input level measurements in a range of the attenuation set values from 0 dB to 60 dB. When completing this process, the attenuation variable $j$ is reset to zero at step 1124 so as to allow input level measurements to be made in the attenuation range between 0 dB and 60 dB. Next, at step 1126, the temperature variable $m$ is incremented by one to prepare for input level measurements with the next temperature set value. Subsequently, at step 1128, the flow is returned to and repeated from step 1102 until T1 is equal to 60° C., so as to measure the input level in a range of the temperature set values from 0° C. to 60° C. When completing this process, the table X1 has been created.

FIG. 14 shows an illustration of the table X1 in which correction values are rounded below the decimal point (actually, the correction values may have up to the seventh decimal place at maximum).

FIG. 15 shows an illustration of the correction table X2 for IF ATT 122. Since this table can be created by a flow similar to that shown in FIG. 13 (however, the steps associated with the frequency setting are not necessary), explanation on the creation procedure will be omitted. With the table X2, an IF attenuation A2 is set from 0 dB to 65 dB (at intervals of 5 dB), i.e., A2=5*k (k is an IF attenuation variable set from zero to 13). Temperature T2 is set in the same range and thus it is expressed by T2=(−10)+10*n, where n=0–7.

FIG. 16 shows an illustration of the correction table X3 for IF AMP 125. Since this table is also created by a similar flow to that of FIG. 13 (however, steps associated with the setting of the frequency and attenuation are not necessary), explanation on the creation procedure will be omitted. Temperature T3 is set in the same range and thus it is expressed by T3=(−10)+10*p, where p=0–7.

Figure 17:
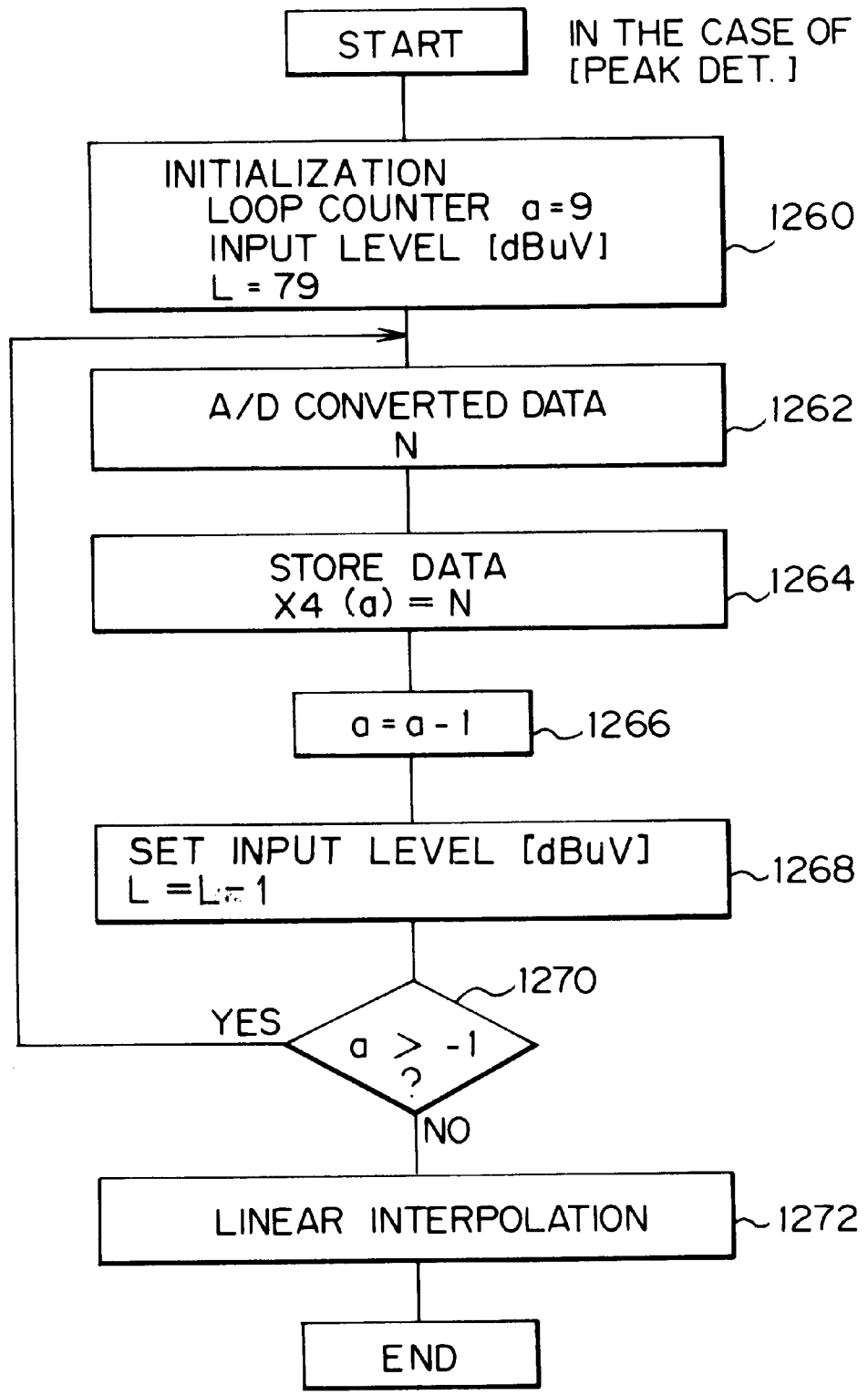
FIG. 17 is a flow chart showing a procedure of creating a correction table X4.

Referring to FIGS. 17 and 18, a procedure of creating the correction table X4 for the peak detector 126 will be explained. Referring first to a flowchart of FIG. 17, first at step 1260, an input level applied to the input terminal of the tuner section 100 is initially set to 79 dBuV, and a loop counter $a$ to nine. The loop counter $a$ is set to nine because the peak detector 126 is used with its output level ranging from 0 dB to 9 dB (corresponding to 2–5 volts) as mentioned above. As explained in connection with FIG. 13, respective variation factors of the remaining circuits in the TV system are maintained constant. Next, an A/D converted version of an output generated by the peak detector when the input level L=79 dBuV is applied to the input terminal of the tuner section 100, is designated N at step 1262, and stored in the table X4 at a location defined by the value of the variable $a$ at step 1264. Subsequently, the variable $a$ is decremented by one at step 1266, and the input level L is decreased by 1 dBuV at step 1268. Then, at step 1270, the flow is returned to and repeated from step 1262 until the variable $a$ is equal to −1, so as to measure the output N of the peak detector in a range of the variable $a$ from nine to zero, i.e., in a range of the input level from 79 to 70 dBuV. The completion of this process means that the measurements made with the level values enclosed in parentheses "< >" in FIG. 18 have been completed. More specifically, when the input level is at 79 dBuV, the output level is 9.0 dB with a measured A/D value being equal to 992. Similarly, when the input level is at 71 dBuV, the output level is 1.0 dB with a measured A/D value being equal to 398 while when the input level is at 70 dBuV, the output level is 0.0 dB with a measured A/D value being equal to 380 (all measured A/D values, with the variable a changed from nine to zero, are 992 (shown), 751, 625, 550, 491, 455, 430, 415, 398 (shown), and 380 (shown). The input level of ADC 312 ranges from zero volt to five volts.

At subsequent step 1272, the measured A/D values are used to calculate the other output levels through linear interpolation for the measured A/D values ranging from zero to 1023, thus creating the table shown in FIG. 18.

By the processes described above, the correction tables X1–X4 for providing relative correction values are created.

Figure 19:
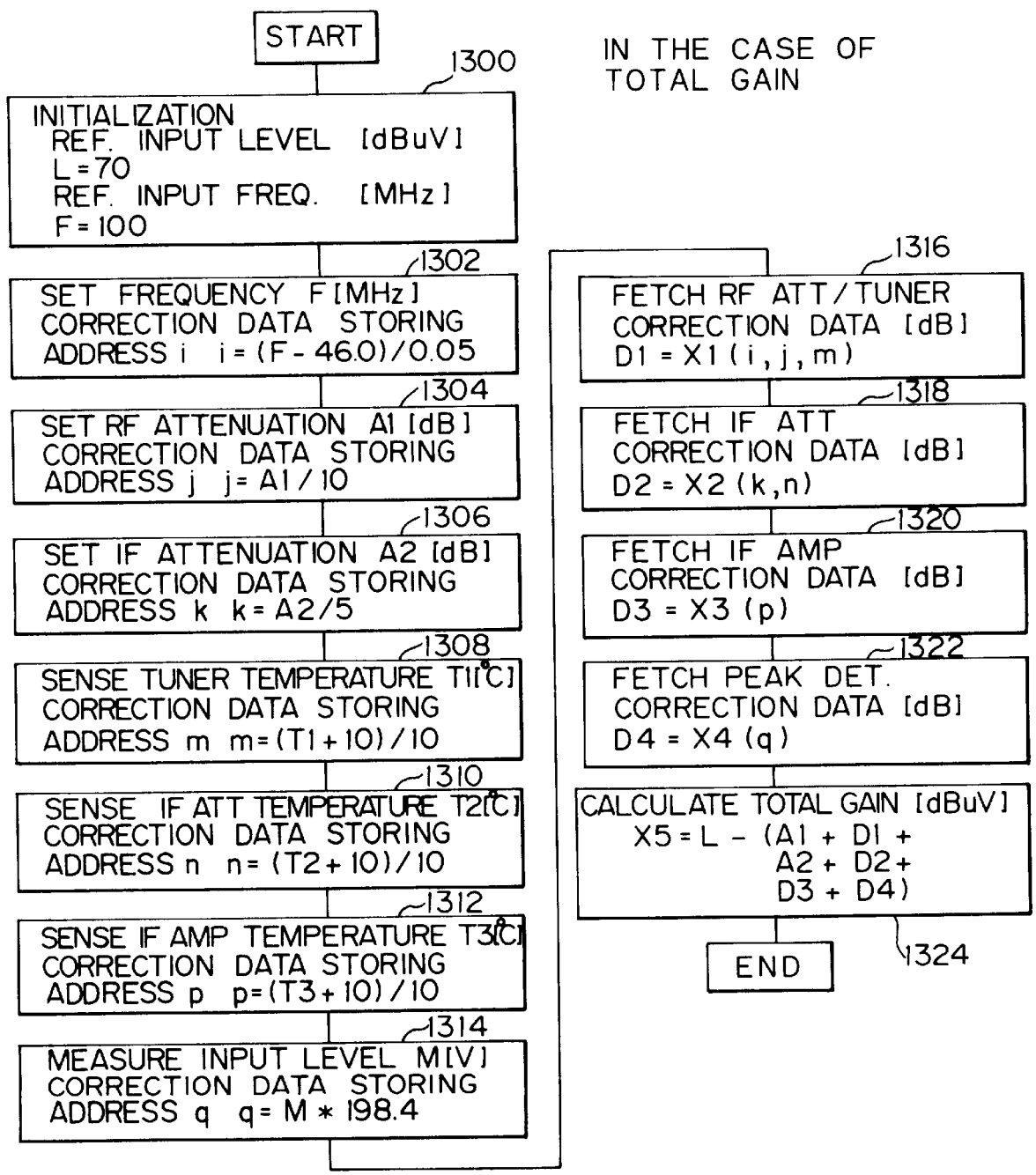
FIG. 19 is a flow chart showing a procedure of deriving a correction value X5.

Referring now to FIG. 19, the correction table X5 for the total gain (absolute value) will be explained. In the embodiment, the correction table X5 is realized by a calculation flow. It should be noted that the table X5 may also take a form of a table such as the correction tables X1–X4.

First, at step 1300, the level and frequency of a reference input applied to the input terminal of the tuner section 100 are initially determined in order to examine the TOTAL gain at a particular point within different operating conditions of the TV system. At initial steps 1302–1306, the tuner section 100 is placed in a fixed operating condition. More specifically, the tuning frequency F of the PLL tuner 121 is set to 100 MHz, and an address i of the correction table X1 therefor is calculated (refer to the equation shown at step 1106 of FIG. 13). At step 1304, the PLL tuner 121 is set to a particular RF attenuation A1, and an address j of the correction table X1 therefor is calculated (refer to the equation shown in step 1104 of FIG. 13). At step 1306, IF ATT 122 is set to a particular IF attenuation A2, and an address k of the correction table X2 therefor is calculated (from the aforementioned equation A2=5*k).

At a series of subsequent steps 1308–1312, current temperatures at respective portions of the tuner section 100 are sensed. Specifically, at step 1308, a temperature T1 at the PLL tuner 121 is sensed, and an address m in the correction table X1 is calculated from the sensed value (refer to the equation shown at step 1102 of FIG. 13). At step 1310, a temperature T2 at IF ATT 122 is sensed, and an address n in the correction table X2 is calculated from the sensed value (with a similar equation to that at step 1308). Similarly, at step 1312, a temperature T3 at IF AMP 125 is sensed, and an address p in the correction table X3 is calculated (with a similar equation to that at step 1308). At next step 1314, an output level of the peak detector is measured, and an address q in the correction table X4 is calculated from the measured value M (V) of the output level. The equation for this calculation, when M=5 volts (corresponding to 9 dB), for example, is expressed by 5*198.4=992 which serves as the address q in the correction table X4. Other values are also calculated in a similar manner. It should be noted that although the calculation for M=2 is expressed by 2*198.4= 396.8 but "380" is stored in the table X4, a difference of such a degree is tolerable.

Next, at steps 1316–1322, respective correction values are fetched from the correction tables X1–X4 by using the previously calculated addresses i, j, k, m, n, p and q, and the fetched correction values are designated D1, D2, D3 and D4, respectively. When any of the addresses m, n, p and q include decimal places, D1–D4 may be calculated by using an interpolation method such as linear interpolation and so on. At final step 1324, the respective correction values D1–D4 and the attenuations A1 and A2 are subtracted from the reference input level L to derive a correction value X5 for the total gain.

Thus, the procedures of creating the respective correction tables have been explained.

Figure 20:
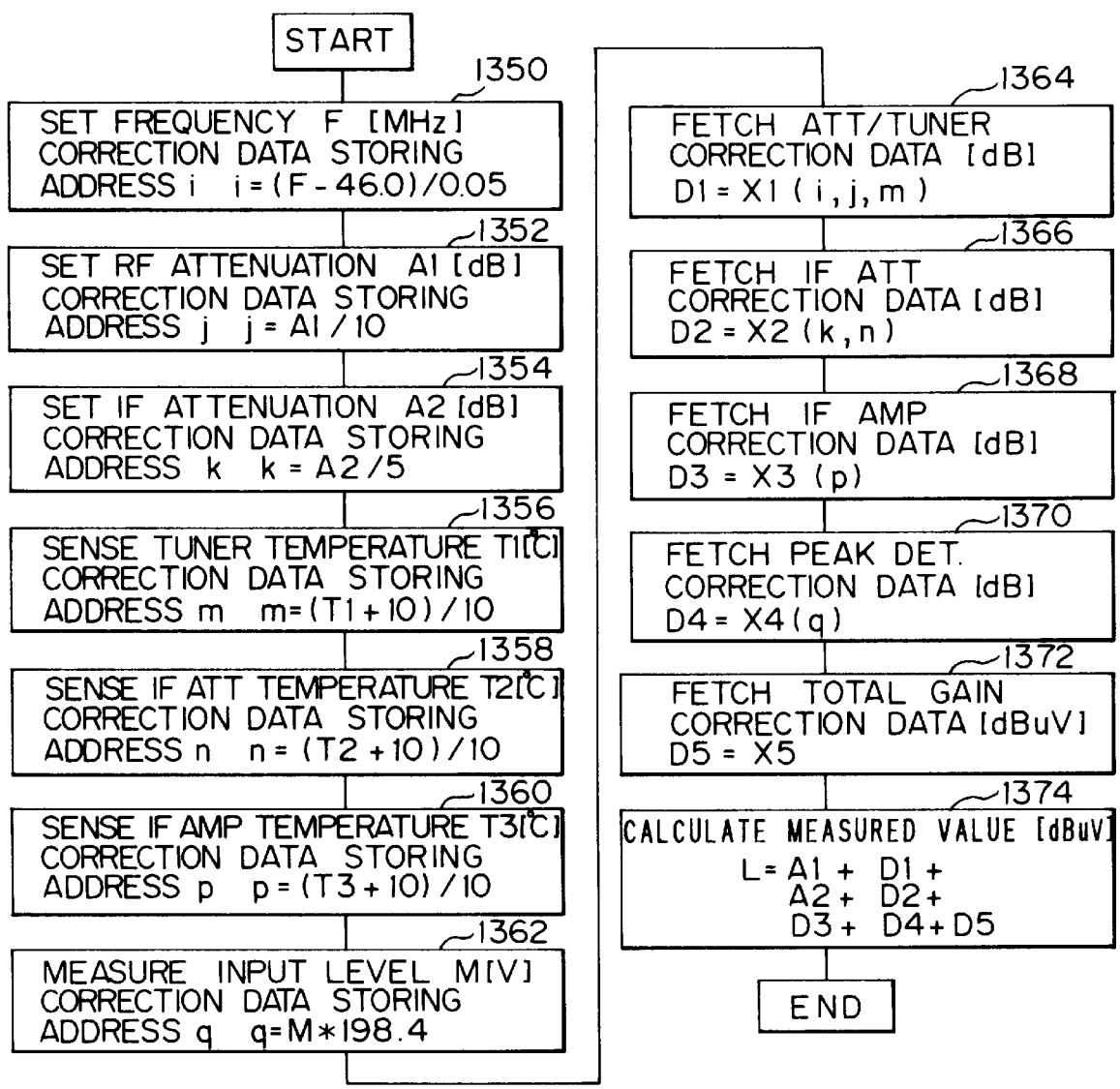
FIG. 20 is a flow chart showing a procedure of a measurement made by the TV level meter using the correction tables X1–X4 and the correction value X5.

Referring now to FIG. 20, a procedure of a measurement made by a TV level meter using the correction tables X1–X4 and the correction value X5 will be explained. A measurement flow shown in FIG. 20 is similar to the flow of FIG. 19, wherein steps 1350–1370 are identical to steps 1302–1322. However, set to F at step 1350 is a frequency under measurement. At step 1372, the correction value X5 derived by the flow of FIG. 19 is fetched and designated D5. At final step 1374, the level L of a signal inputted to the TV level meter is calculated by summing all of D1–D5 and A1 and A2.

Figure 21A:
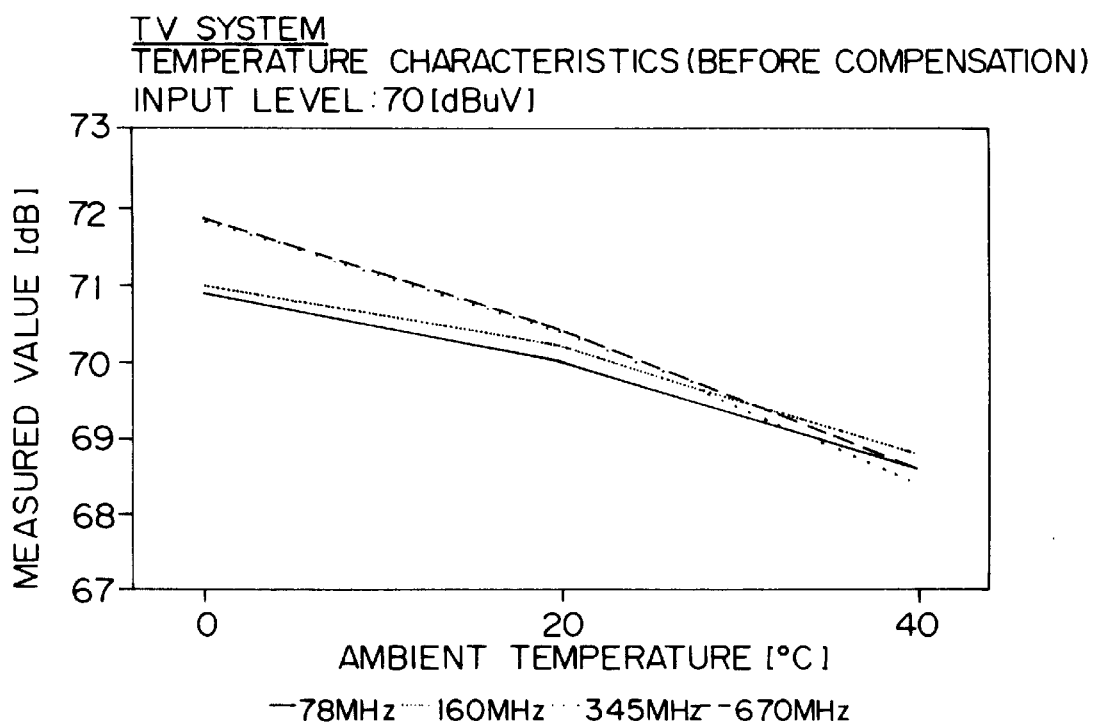
FIGS. 21(A) and 21(B) are graphs showing the temperature characteristics of the TV circuit system in the TV level meter before compensation (FIG. 21(A)) and after compensation (FIG. 21(B)) according to the present invention.
Figure 21B:
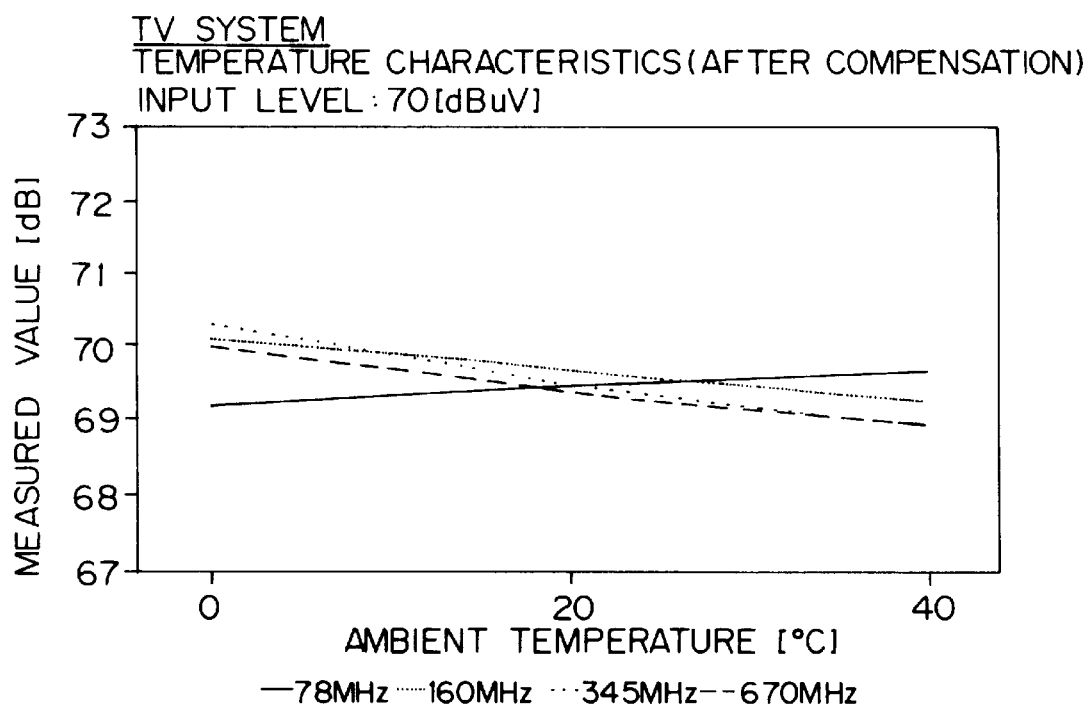
Figure 22A:
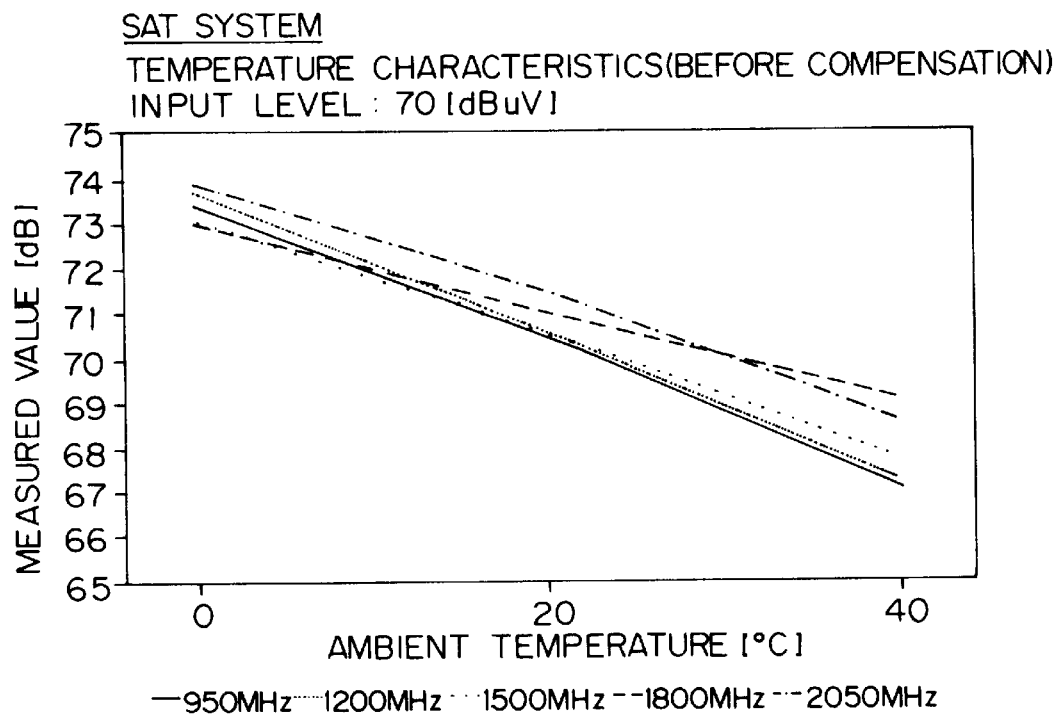
FIGS. 22(A) and 22(B) are graphs showing the temperature characteristics of a SAT system in the TV level meter before compensation (FIG. 22(A)) and after compensation (FIG. 22(B)) according to the present invention.
Figure 22B:
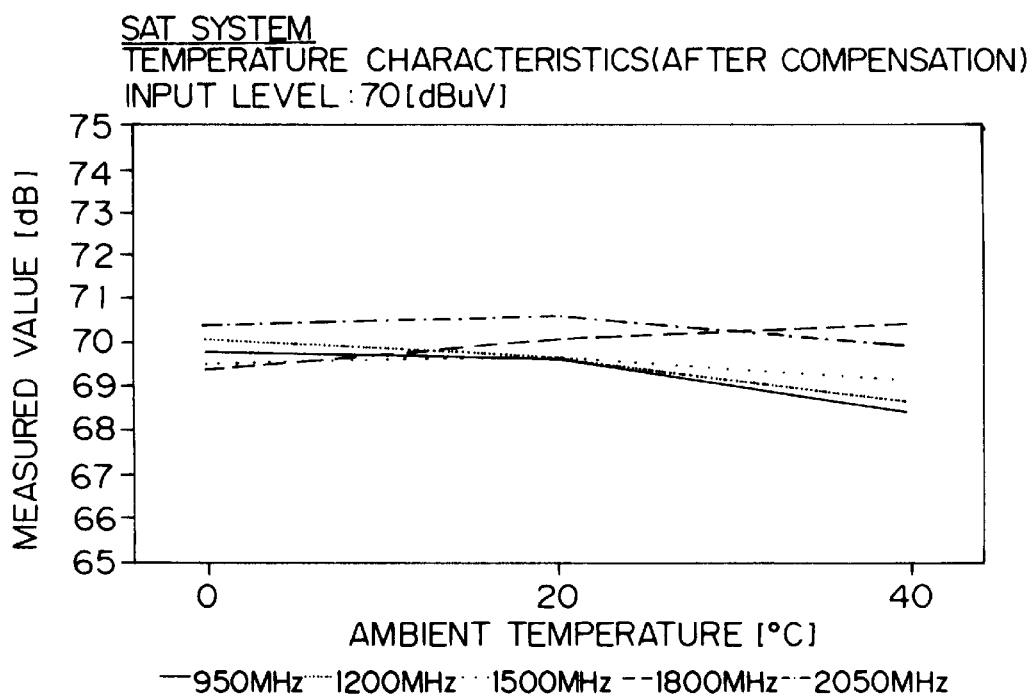

FIGS. 21(A) and 21(B) shows temperature characteristics of the above described TV system of the TV level meter before compensation (FIG. 21(A)) and after compensation (FIG. 21(B)). As will be understood from the graphs, the width of variations due to temperature extends 2–3 dB before compensation, while the width is reduced to 1 dB or less after the compensation. For reference, FIGS. 22(A) and 22(B) also show like temperature characteristics of the SAT system. It can be seen from these graphs that the width of variations extending 5–6 dB before the compensation is decreased to 1 dB or less after the compensation. Such a compensation for a wide range over 78 MHz–670 MHz is extremely difficult for only conventional circuit techniques to accomplish.

While the present invention has been described above in connection with a measuring device as an embodiment, this is a mere illustration, and the present invention can also be applied to a variety of other signal processing devices.

According to the compensating method and apparatus of the present invention, warm-up time conventionally required to measuring devices and so on can be substantially eliminated so that a device can be used for measurement immediately after power on. Also, the present invention enables the devices to be powered by a battery or designed to be suitable for battery-powered use. Further, it is possible to relatively easily make compensation for complicated variations in characteristics, which has been difficult or impossible with conventional circuit techniques. Furthermore, highly accurate devices can be provided at a lower cost.

What is claimed is:

1. A method of compensating a signal processing circuit using a compensation circuit, wherein said signal processing circuit is operative to receive an input signal and generate an output signal, said signal processing circuit including at least two circuit portions each having characteristics varying dependent upon at least one of a plurality of categories of circuit conditions, said plurality of categories of circuit conditions including a static circuit condition, a dynamic circuit condition and a circuit environmental condition, said method comprising the steps of:

(a) providing correction value data, said correction value data being adapted to be applied to the output signal generated from said signal processing circuit in order to generate a compensated output signal that compensates for variations in the characteristics of each of said at least two circuit portions, wherein the correction value data is independent of characteristics of any circuit elements that receive the compensated output signal;

(b) applying to said signal processing circuit a given input signal to acquire an output signal corresponding thereto; and (c) after step (b), correcting said acquired output signal corresponding to said given input signal using the compensation circuit and in accordance with said correction value data to generate the compensated output signal, said correcting of said output signal being performed externally to said signal processing circuit and not accounting for any varying characteristics of any elements that receive the compensated output signal.

2. A method according to claim 1, wherein said correction value data are provided in the form of a correction value table.

3. A method according to claim 2, wherein said at least two circuit portions include a first circuit having characteristics varying dependent upon said dynamic circuit condition and said circuit environmental condition, and wherein said step (a) includes providing, for said first circuit, a first correction value table including at least one parameter associated with said dynamic circuit condition and at least one parameter associated with said circuit environmental condition, and wherein said step (c) includes retrieving and using a correction value for said first circuit from said first correction value table in response to a combination of a respective current value of said at least one parameter associated with said dynamic circuit condition and a respective current value of said at least one parameter associated with said circuit environmental condition.

4. A method according to claim 3, wherein the characteristics of said first circuit also vary dependent upon said static circuit condition.

5. A method according to claim 2, wherein said at least two circuit portions include a second circuit having characteristics varying dependent upon said circuit environmental condition, and wherein said step (a) includes providing, for said second circuit, a second correction value table including at least one parameter associated with said circuit environmental condition, and wherein said step (c) includes retrieving and using a correction value for said second circuit from said second correction value table in response to a respective current value of said at least one parameter associated with said circuit environmental condition.

6. A method according to claim 5, wherein the characteristics of said second circuit also vary dependent upon said static circuit condition.

7. A method according to claim 2, wherein said at least two circuit portions include a third circuit having characteristics varying dependent upon said dynamic circuit condition, and wherein said step (a) includes providing, for said third circuit, a third correction value table including at least one parameter associated with said dynamic circuit condition; and wherein said step (c) includes retrieving and using a correction value for said third circuit from said third correction value table in response to a respective current value of said at least one parameter associated with said dynamic circuit condition.

8. A method according to claim 7, wherein the characteristics of said third circuit also vary dependent upon said static circuit condition.

9. A method according to claim 2, wherein said at least two circuit portions include a fourth circuit having characteristics only varying dependent upon said static circuit condition, and wherein said step (a) includes providing, for said fourth circuit, a fourth correction value table including a parameter associated with the magnitude of said output signal of said signal processing circuit, and wherein said step (c) includes retrieving and using a correction value for said fourth circuit from said fourth correction value table in response to a current value of said parameter associated with said output signal.

10. A method according to claim 1, wherein said dynamic circuit condition, said circuit environmental condition, and said static circuit condition each include at least one parameter.

11. A method according to claim 10, wherein said circuit environmental condition includes a parameter of temperature.

12. A method according to claim 10, wherein said dynamic circuit condition includes a parameter of frequency or attenuation.

13. A method according to claim 10, wherein said static circuit condition is defined by characteristics of a predetermined element used in the circuit.

14. A method according to any one of claims 1–13, wherein said signal processing circuit comprises a measuring circuit.

15. A compensating apparatus for a signal processing circuit, wherein said signal processing circuit is operative to receive an input signal and generate an output signal, said signal processing circuit including at least two circuit portions each having characteristics varying dependent upon at least one of a plurality of categories of circuit conditions, said plurality of categories of circuit conditions comprising a static circuit condition, a dynamic circuit condition and a circuit environmental condition, said compensating apparatus comprising:

(a) correction data generating means for generating correction value data, said correction value data being adapted to be applied to said output signal generated from said signal processing circuit, in order to generate a compensated output signal that compensates for variations in the characteristics of each of said at least two circuit portions, wherein the correction value data is independent of characteristics of any circuit elements that receive the compensated output signal; and (b) correcting means provided externally to the signal processing circuit and connected to receive said output signal from said signal processing circuit and also connected to receive said correction value data from said correction data generating means, for correcting said output signal in accordance with said correction value data to generate the compensated output signal without accounting for any varying characteristics of any elements that receive the compensated output signal.

16. An apparatus according to claim 15, wherein said correction value data are provided in the form of a correction value table.

17. An apparatus according to claim 16, wherein said at least two circuit portions include a first circuit having characteristics varying dependent upon said dynamic circuit condition and said circuit environmental condition, and wherein said signal processing circuit includes setting signal generating means for generating a signal for setting a value to the dynamic circuit condition for said first circuit, and sensing means for sensing a value of said circuit environmental condition of said first circuit, and wherein said correction data generating means includes, for said first circuit, a first correction value table including at least one parameter associated with said dynamic circuit condition and at least one parameter associated with said circuit environmental condition, said correction data generating means being operative to retrieve and generate a correction value from said first correction value table in response to a combination of a current value of said dynamic circuit condition from said setting signal generating means and a current value of said circuit environmental condition from said sensing means.

18. An apparatus according to claim 17, wherein the characteristics of said first circuit also vary dependent upon said static circuit condition.

19. An apparatus according to claim 16, wherein said at least two circuit portions include a second circuit having characteristics varying dependent upon said circuit environmental condition, and wherein said signal processing circuit includes sensing means for sensing a value of said circuit environmental condition of said second circuit, said correction data generating means including, for said second circuit, a second correction value table including at least one parameter associated with said circuit environmental condition, and said correction data generating means being operative to retrieve and generate a correction value for said second circuit from said second correction value table in response to a current value of said circuit environmental condition from said sensing means.

20. An apparatus according to claim 19, wherein the characteristics of said second circuit also vary dependent upon said static circuit condition.

21. An apparatus according to claim 16, wherein said at least two circuit portions include a third circuit having characteristics only varying dependent upon said dynamic circuit condition, and wherein said signal processing circuit includes setting signal generating means for generating a signal for setting a value to said dynamic circuit condition for said third circuit, said correction data generating means including, for said third circuit, a third correction value table including at least one parameter associated with said dynamic circuit condition, said correction data generating means being operative to retrieve and generate a correction value for said third circuit from said third correction value table in response to a current value of said dynamic circuit condition from said setting signal generating means.

22. An apparatus according to claim 21, wherein the characteristics of said third circuit also vary dependent upon said static circuit condition.

23. An apparatus according to claim 16, wherein said at least two circuit portions include a fourth circuit having characteristics only varying dependent upon said static circuit condition, and wherein said correction data generating means includes a fourth correction value table including a parameter associated with the magnitude of said output signal of said signal processing circuit, said correction data generating means being operative to retrieve and generate a correction value from said fourth correction value table in response to a current value of said parameter associated with said output signal.

24. An apparatus according to claim 15, wherein said dynamic circuit condition, said circuit environmental condition, and said static circuit condition each include at least one parameter.

25. An apparatus according to claim 24, wherein said circuit environmental condition includes a parameter of temperature.

26. An apparatus according to claim 24, wherein said dynamic circuit condition includes a parameter of frequency or attenuation.

27. An apparatus according to claim 24, wherein said static circuit condition is defined by characteristics of a predetermined element used in said circuit.

28. An apparatus according to any one of claims 15–27, wherein said signal processing circuit comprises a measuring circuit.

29. A signal processing apparatus for performing signal processing on an input signal applied to the signal processing apparatus, comprising:

(a) a signal processing circuit coupled to receive said input signal for generating a circuit output signal, said signal processing circuit including first and second circuits each having characteristics varying dependent upon a dynamic circuit condition and a circuit environmental condition;

(b) condition setting signal generating means for generating signals for setting values to said dynamic circuit condition of said first and second circuits;

(c) sensing means for sensing values of said circuit environmental condition of said first and second circuits;

(d) correction data generating means including first and second correction value tables for said first and second circuits, respectively, said first and second correction value tables each including at least one parameter associated with said dynamic circuit condition and at least one parameter associated with said circuit environmental condition, said correction data generating means being operative to retrieve and generate first and second correction values from said first and second correction value tables, respectively, in response to current values of said dynamic circuit conditions from said condition setting signal generating means and a current value of said circuit environmental condition from said sensing means; and (e) compensating means provided externally to the signal processing circuit and coupled to receive said circuit output signal from said signal processing circuit and also coupled to receive said first and second correction values from said correction data generating means for correcting said signal processing circuit output signal in accordance with said first and second correction values for said first and second circuits to provide an output signal generated by the signal processing apparatus.

30. An apparatus according to claim 29, wherein the characteristics of said first circuit or said second circuit also vary dependent upon a static circuit condition.

31. An apparatus according to claim 29, wherein said signal processing circuit includes a third circuit having characteristics varying dependent upon said circuit environmental condition, and wherein said sensing means includes means for sensing a value of said circuit environmental condition of said third circuit, said correction data generating means including a third correction value table including at least one parameter associated with said circuit environmental condition of said third circuit, said correction data generating means being operative to retrieve and generate a third correction value from said correction value from said third correction value table in response to a respective current value of said at least one parameter associated with said circuit environmental condition, and wherein said compensating means corrects said circuit output signal in accordance with said first and second correction values and said third correction value.

32. An apparatus according to claim 31, wherein the characteristics of said third circuit also vary dependent upon a static circuit condition.

33. An apparatus according to claim 29, wherein said signal processing circuit includes a fourth circuit having characteristics only varying dependent upon said dynamic circuit condition, and wherein said condition setting signal generating means generates a signal for setting a value to said dynamic circuit condition for said fourth circuit, said correction data generating means including a fourth correction value table for said fourth circuit, said fourth correction value table including at least one parameter associated with said dynamic circuit condition, said correction data generating means being operative to retrieve and generate a fourth correction value from said fourth correction value table in response to a current value of said dynamic circuit condition from said setting signal generating means, and wherein said compensating means corrects said circuit output signal in accordance with a set of correction values including said first and second correction values from said correction data generating means.

34. An apparatus according to claim 33, wherein the characteristics of said fourth circuit also vary dependent upon said static circuit condition.

35. An apparatus according to claim 29, wherein said signal processing circuit includes a fifth circuit having characteristics only varying dependent upon said static circuit condition, and wherein said correction data generating means includes a fifth correction value table including a parameter associated with the magnitude of said circuit output signal of said signal processing circuit, said correction data generating means being operative to retrieve and generate a fifth correction value from said fifth correction value table in response to a current value of said parameter associated with said circuit output signal, and wherein said compensating means corrects said circuit output signal in accordance with a set of correction values including said first and second correction values from said correction data generating means.

36. An apparatus according to any one of claims 29–35, wherein said signal processing apparatus comprises a measuring device.

* * * * *